United States Patent [19]

Ono

[11] 3,798,513

[45] Mar. 19, 1974

[54] SEMICONDUCTOR DEVICE HAVING A SURFACE PARALLEL TO THE [100] PLANE AND A CHANNEL STOPPER PARALLEL TO THE [111] PLANE

[75] Inventor: Minoru Ono, Tokyo, Japan

[73] Assignee: Hitachi, Ltd., Tokyo, Japan

[22] Filed: Dec. 1, 1970

[21] Appl. No.: 94,089

[30] Foreign Application Priority Data

Dec. 1, 1969 Japan ................................ 44-95707

[52] U.S. Cl.... 317/235 R, 317/235 G, 317/235 AG

[51] Int. Cl. ............................................ H01l 19/00

[58] Field of Search .............. 317/235, 47, 47.1, 46, 317/48.5, 234

[56] References Cited

UNITED STATES PATENTS

| | | | |
|---|---|---|---|
| 3,142,021 | 7/1964 | Stelmak | 317/235 |
| 3,648,131 | 3/1972 | Stuby | 317/235 |
| 3,659,160 | 4/1972 | Sloan, Sr. et al. | 317/235 |
| 3,425,879 | 2/1969 | Shaw et al. | 317/235 |
| 3,486,892 | 12/1969 | Rosvold | 317/235 |
| 3,566,219 | 2/1971 | Nelson et al. | 317/235 |
| 3,585,464 | 6/1971 | Castrucci et al. | 317/235 |
| 3,586,925 | 6/1971 | Collard | 317/235 |

OTHER PUBLICATIONS

IBM Tech. Discl. Bul., "Junction Isolation in Germanium by Alloy Process" by Gansavge, Vol. 9, No. 6, November, 1966, page 697.

Journal of Applied Physics, "Anisotropic Etching of Silicon" by Lee, Vol. 40, No. 11, October, 1969, pages 4569–4574.

*Primary Examiner*—Jerry D. Craig
*Attorney, Agent, or Firm*—Craig and Antonelli

[57] ABSTRACT

A semiconductor device having a parasitic channel stopper, in which a major surface of the semiconductor substrate lies in a plane parallel to a {100} plane; a predetermined portion of the major surface in which a parasitic channel is induced is converted into a {111} plane by etching the {100} plane; since the converted portion under a passivation film, such as silicon dioxide film is a substantially highly doped region ($N^+$), it acts as a P parasitic channel stopper.

6 Claims, 11 Drawing Figures

INVENTOR.
MINORU ONO
BY Craig, Antonelli, Stewart & Hill
ATTORNEYS

FIG. 3
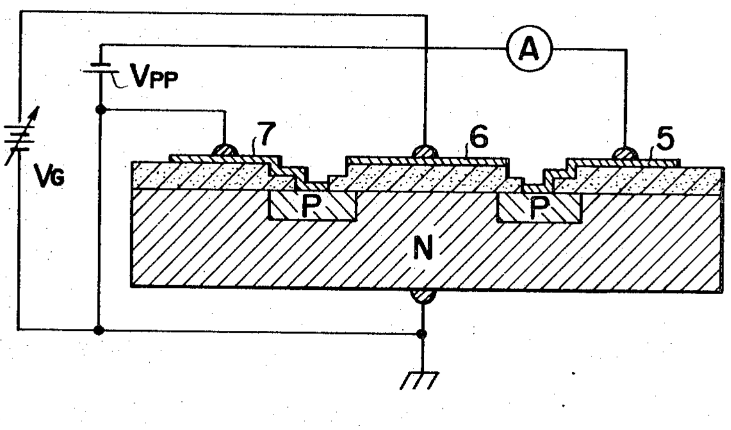
FIG. 4
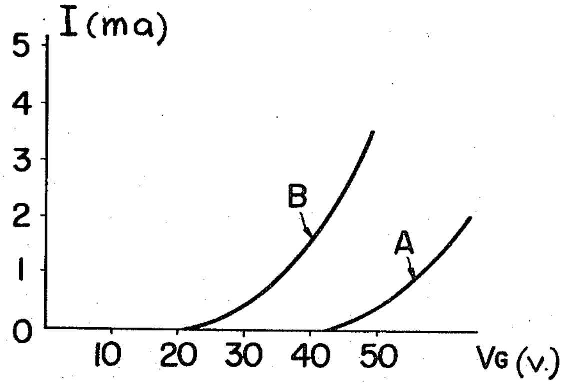
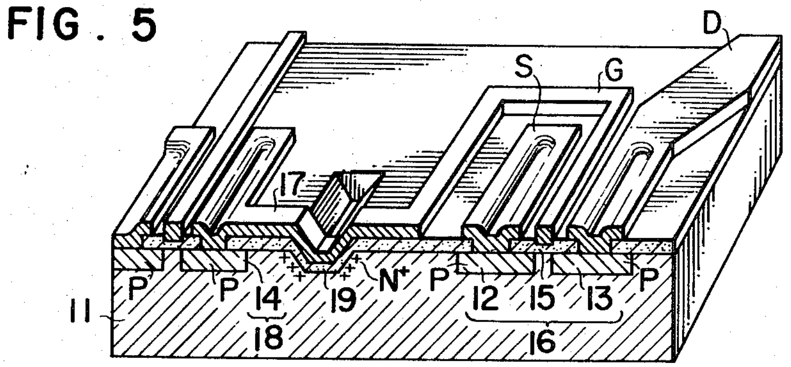
INVENTOR.
MINORU ONO
BY Craig, Antonelli, Stewart & Hill
ATTORNEYS INVENTOR.
MINORU ONO
BY Craig, Antonelli, Stewart & Hill
ATTORNEYS

SEMICONDUCTOR DEVICE HAVING A SURFACE PARALLEL TO THE [100] PLANE AND A CHANNEL STOPPER PARALLEL TO THE [111] PLANE

This invention relates to a semiconductor device having an insulating film, especially to a channel stopper means therefor.

It has proved effective for protecting a semiconductor surface from dirt such as moisture etc., to cover the semiconductor surface with a protecting film of an insulator; on the other hand, carriers such as electrons or holes are equivalently induced on the semiconductor surface which forms an interface with the insulating film by being covered with the insulating film or by the existence of a charge caused, for instance by ions on or in the insulating film, whereby the conductance or conductivity type of the semiconductor surface is changed. This phenomenon is well known as a channel effect. This phenomenon usually causes damages in the electric characteristics of the semiconductor device such as the leakage current characteristics, and therefore requires to be restrained or eliminated. For example, in a semiconductor device in which a PN junction reaches a semiconductor surface and an insulating film covers the junction, a channel (inversion) layer is generated at the semiconductor surface under the insulating film, and the channel layer is electrically connected to the PN junction, whereby the area of the PN junction is substantially enlarged. Also since a PN junction comprising the channel layer and the semiconductor reaches the edge of the semiconductor substrate, the leakage current of the junction is increased so that in a semiconductor integrated circuit device the ability of isolating between portions which are needed to be electrically isolated from each other, is reduced. In case a film is used causing the surface of the semiconductor substrate to be of the same conductivity type as the substrate, it results in bad influences on the breakdown voltage of the PN junction.

In order to reduce the channel, it has been proposed in the Japanese Pat. application No. 39-7388 (Japanese Pat. Publication No. 42-21446) that a {100} plane and a {110} plane or crystal planes substantially parallel thereto, be used for a major surface of the semiconductor substrate having a diamond lattice structure to decrease the amount of the carriers induced by the insulating film since the amount of the carriers induced on the semiconductor surface exclusively by the insulating film depends on the bonding angle of semiconductor atoms or the density thereof in contact with the insulating film.

But in case of use of a semiconductor substrate having the {100} crystal plane or a crystal plane substantially parallel thereto, since the amount of the carriers induced exclusively by the insulating film is small, if a specific charge which induces carriers having a conductivity type opposite to the above-mentioned carriers exists on or in the insulating film, there exists the danger of the generation of a channel layer since the conductivity type of the semiconductor surface is easily inverted, and there also exists the defect that the bad influences of the mentioned parasitic channel become large.

Generally, a suitable conductor is formed on an insulating film formed on the surface of a semiconductor substrate, for example, when a circuit element formed in the semiconductor substrate is so small that a conductor for an external connection cannot be directly connected thereto, or when the circuit elements formed in the semiconductor substrate are electrically connected to each other or to other portions in the semiconductor integrated circuit device.

In the semiconductor device in which the conductor is formed on the surface of the semiconductor substrate over the insulating film, when a voltage is applied between the conductor and the semiconductor substrate, electrons or holes are induced on the surface of the semiconductor substrate according to the polarity or direction of the voltage (electric field), whereby the conductance of the surface of the semiconductor substrate or the conductivity type thereof is changed.

The change of the surface of the semiconductor substrate caused by the applied voltage, especially a channel layer, a so-called parasitic channel generated by the inversion of the conductivity type and connected to a PN junction exerts the same bad influences on the device as the above described channel layer generated by the insulating film.

The parasitic channel is liable to be generated as the strength of the applied electric field between the semiconductor substrate and the conductor becomes strong and the resistivity of the semiconductor substrate becomes high.

In a semiconductor substrate having a major surface comprising the {100} crystal plane or a crystal plane substantially parallel thereto, the change of the conductance by the electric field vertically applied to the substrate is larger than in a semiconductor substrate having other crystal planes. Therefore, by using the {100} crystal plane as a major surface of a semiconductor substrate, the characteristics of a semiconductor device, for example, of an MOS field effect transistor which takes advantage of the change of the conductance can be improved, but on the other hand there exists the defect that the {100} plane is liable to be affected by the parasitic channel caused by the inversion layer.

Also in the case of using the {100} plane, since carriers induced by an insulating film are offset by the generation of a parasitic channel caused by a conductive layer formed on the insulating film, and since the amount of the carriers induced by the insulating film is small, the parasitic channel is more easily generated than using a crystal plane other than the {100} plane.

It is usually proposed heretofore to form a diffused region having a sufficiently high concentration in order to prevent the generation of the channel or the parasitic channel on a semiconductor substrate as a channel stopper.

However, in an insulated gate type field effect semiconductor device, in which an insulating film is formed on the surface of a semiconductor substrate, a gate electrode is formed on the insulating film, and an electric field is applied to the semiconductor substrate by the electrode to positively utilize the change of the electric characteristics of the surface of the semiconductor substrate, a special, additional step for doping an impurity is needed to form the channel stopper so that the manufacturing steps are increased as a result thereof. Also in the step of doping the impurity, the impurity may reach a semiconductor circuit element, whereby bad influences are exerted on the active operation of the circuit element.

Accordingly, it is an object of this invention to provide a semiconductor device, in which the occurrence of a channel layer by an insulating film or the occurrence of a parasitic channel layer on the surface of a semiconductor surface covered with the insulating film can be prevented.

It is another object of the present invention to provide an insulated gate type field effect transistor and/or a semiconductor integrated circuit device which includes a number of semiconductor elements, a plurality of which are provided with a channel stopper formed by simple steps.

A feature of this invention is the application of a groove or a projection having at least a surface other than a {100} crystal plane, to a major surface of a semiconductor substrate so as to interrupt a parasitic channel which adversely affects the high voltage characteristics.

In a semiconductor device having an insulating film at least on a portion of a semiconductor substrate surface, the semiconductor surface covered with the insulating film is of a {100} plane or of a crystal plane substantially parallel thereto and includes a cavity or a projection, in which a crystal plane other than the above-mentioned substrate surface plane, for example, a {111} 9 plane or a crystal plane substantially parallel thereto is formed, and the cavity or the projection is disposed on the semiconductor surface in such a manner that a channel layer or a parasitic channel layer induced in or on the semiconductor surface can be stopped.

These and further objects, features and advantages of the present invention will become apparent from the following description when taken in conjunction with the drawing which shows, for purposes of illustration only, several embodiments in accordance with the present invention, and wherein FIG. 1*a* is a cross-sectional view of a semiconductor device whose semiconductor surface consists of only a {100} plane;

FIG. 1*b* is a plan view of the device shown in FIG. 1*a;*

FIG. 2*a* is a cross-sectional view of a semiconductor device whose semiconductor surface is a {100} plane in which a {111} plane is partially included;

FIG. 2*b* is a plan view of the device similar to FIG. 2*a;*

FIG. 2*c* is an enlarged cross-sectional view of a cavity shown in the device of FIG. 2*a;*

FIG. 3 illustrates a measuring method for the parasitic channel of the device;

FIG. 4 is a diagram showing characteristic curves indicating the variation of current (I) flowing through the channel against applied voltage ($V_G$);

FIG. 5 is a cross-sectional isometric view of an MOS field effect transistor according to the invention;

Figure 6A:
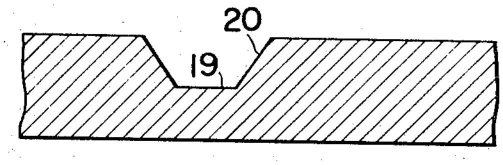
Figure 6B:
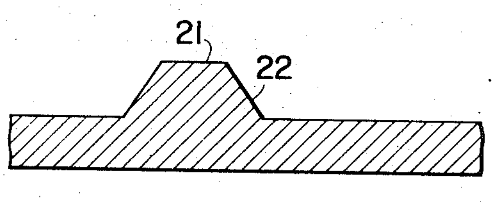
Figure 7:
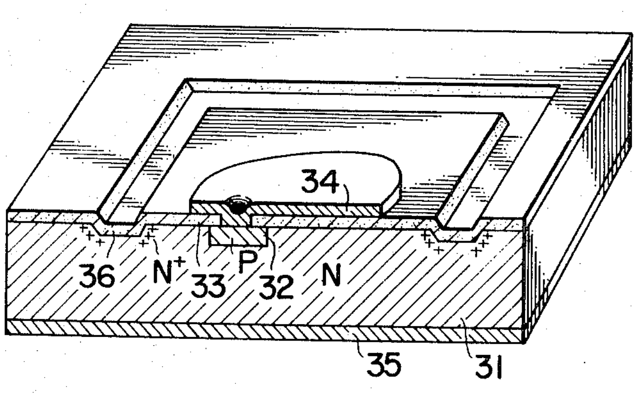

FIG. 6*a* is an enlarged cross-sectional view illustrating a cavity formed on a semiconductor substrate surface of a {100} plane;

FIG. 6*b* is an enlarged cross-sectional view illustrating a projection having {111} planes formed on a semiconductor surface of a {100} plane; and FIG. 7 is a cross-sectional view of a diode according to the invention.

Generally, the amount of electrons or holes on the surface of a semiconductor substrate covered with an insulating film equivalently induced by the insulating film depends on the selected crystal plane for the semiconductor substrate surface. In the case an insulating film is, for example, of silicon oxide, electrons are induced on the surface of a silicon semiconductor substrate, and it has been found that the amount of the induced electrons is minimized when the semiconductor surface comprises a crystal plane parallel to a {100} crystal plane and is maximized in the case a crystal plane parallel to a crystal plane other than the {100} plane, for example, a {111} plane is used. On the other hand, if an electrode is formed on the insulating film as a gate electrode, and if an electric voltage is applied thereto to generate a channel on the semiconductor surface under the insulating film, and if the electric characteristics of the channel are controlled by the change of the applied voltage, in this case, it is known that the threshold voltage is low when the semiconductor surface is parallel to a {100} crystal plane, but when it is parallel to a {111} crystal plane, the threshold voltage is high.

The present invention provides a semiconductor device in which the generation of a channel or a parasitic channel can be effectively prevented by utilizing the above-mentioned principles.

EMBODIMENT 1

An improved semiconductor device according to this invention will be explained hereinafter by reference to FIGS. 2*a* and 2*b*. In the various views of the drawing reference numeral 1 designates a semiconductor substrate of a first conductivity type having a major surface lying substantially parallel to a {100} plane, for example, an N type monocrystalline silicon substrate having a resistivity of 5 to 10 ohms per square; reference numerals 2 and 3 designate a pair of semiconductor regions of a second conductivity type formed in the major surface, for example, P type diffused regions having a surface impurity density of about $5 \times 10^{19}$ to $8 \times 10^{19}$ per cubic centimeter; reference numeral 8 designates a cavity, ditch, groove or the like formed in the major surface between the pair of semiconductor regions 2 and 3 and having a depth of not less than about 1 micron, for example, being 2 microns depth; reference numeral 4 designates an insulating film formed on the major surface of the substrate 1 and on the inner surface of the cavity 8, for example, an insulating film including a silicon compound such as silicon oxide or silicon nitride having a thickness of about 8,000 angstroms; reference numerals 5 and 7 designate conducting layers of a metal such as aluminum, chromium, molybdenum or gold extending over the insulating film 4 and electrically connected to the surface of the semiconductor regions 2 and 3 through holes formed in the insulating film 4, respectively; reference numeral 6 designates a conducting layer extending over the insulating film 4 between the pair of semiconductor regions 2 and 3, the conducting layer 6 being provided to cross over the cavity 8 through the insulating film 4 as shown in FIG. 2*b*. In this invention it is desirable that the cavity 8 has a wall surface lying in a crystal plane other than a {100} plane. It is further desirable that at least one wall surface of the cavity 8 lies substantially parallel to a {111} plane.

Such a semiconductor device is, for example, manufactured by selectively etching a semiconductor substrate 1 in an alkaline hydroxide etchant such as NaOH or KOH by the use of a mask of silicon oxide to form the cavity 8, by forming an insulating film of silicon oxide on the exposed surface of the cavity 8, by selectively etching the insulating film 4 to expose a pair of surface portions of the substrate 1, by diffusing a conductivity type determining impurity into the substrate through the exposed surfaces thereof to form the regions 2 and 3, and then by forming the conducting layers 5, 6 and 7 by a conventional method. In the step of forming the cavity 8, it is desirable that at least one edge of the cavity is formed to be aligned with a <110> direction in order to expose a wall surface lying parallel to a {111} plane in the cavity 8 as shown in FIG. 2*c*. Furthermore, in the step of forming the conducting layer 6 it should be noted that the conducting layer 6 must be formed so as to make the conducting layer 6 completely cross over the cavity 8 at least on a surface portion of the insulating film 4 as shown in FIG. 2*b*.

Figure 1A:
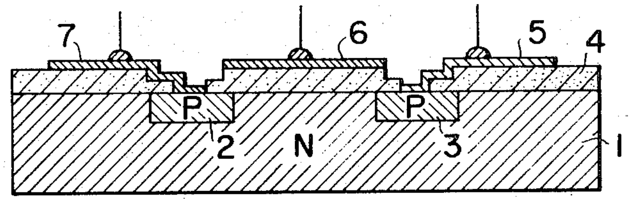
Figure 1B:
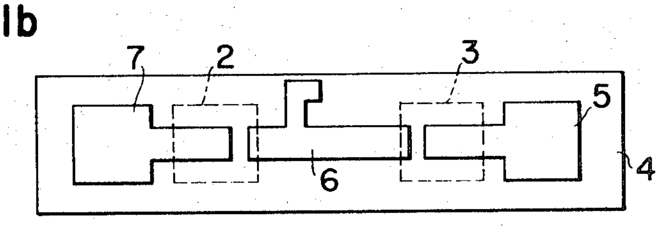

The electric characteristics of a semiconductor device according to this invention which are now superior to those according to the prior art as shown in FIGS. 1*a* and *b*, in which no cavity is provided under the conducting layer 6, will be explained more fully hereinafter.

The electric characteristics between the voltage $V_G$ applied to the conducting layer 6 and the electric current I flowing between the semiconductor regions as shown in FIG. 4 is measured by connecting the devices to voltage supply means as shown in FIG. 3. In the drawing, $V_{pp}$ shows a battery having a constant voltage of 1.5 volts. In FIG. 4, the curve A shows the characteristics of the semiconductor device according to this invention and the curve B shows those according to the prior art. It can be seen from the drawing that no current I flows when the voltage $V_G$ is 40 volts in the device according to this invention, on the other hand, a current of about 2 milliamperes flows in the device according to prior art with a similar voltage $V_G$ of 40 volts. In the case the semiconductor device as shown in FIGS. 2*a* and *b* is used as an MOS field effect transistor, a transistor having a threshold voltage higher than that according to prior art is obtained. Incidentally, it is both appropriate and effective to use some devices of above-described MOS field effect transistors having different threshold voltages as semiconductor elements in an integrated circuit device.

Figure 2A:
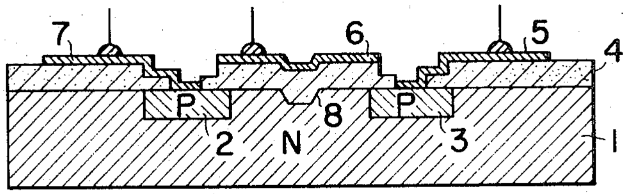
Figure 2B:
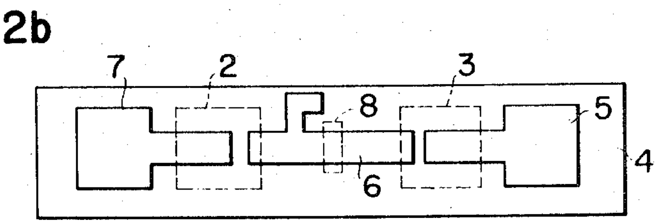
Figure 2C:
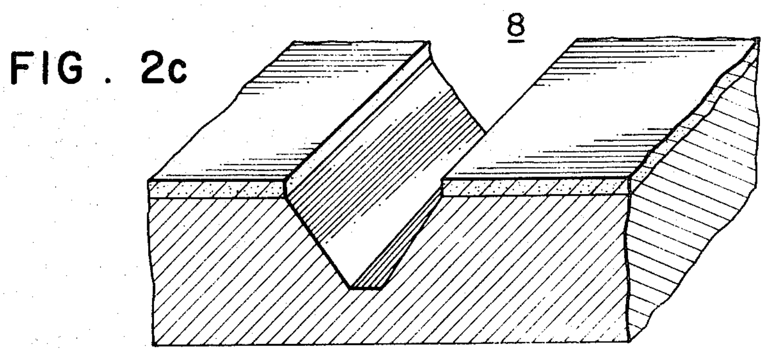

As clearly understood from FIGS. 2*a*, 2*b* and 4, semiconductor regions 2 and 3 can be electrically isolated by PN junctions and the cavity 8 even if a high voltage, for example, up to 40 volts is applied to the electrode layer 6 under which the cavity 8 is formed.

EMBODIMENT 2

An explanation of another embodiment will be made with respect to an MOS semiconductor integrated circuit device comprising MOS field effect transistors.

As shown in FIG. 5, P-type regions 12, 13 and 14 are partially formed in an N-type silicon semiconductor substrate 11 by the well known technique of selectively diffusing an impurity or epitaxially growing the regions. The P-type regions 12 and 13 are juxtaposed with a predetermined space therebetween. Then a silicon oxide film 15 is grown on the surface of the substrate 11 by a thermal oxidization technique or thermal decomposition of organic silane, and metal electrodes S, D and G are formed on the P-type regions 12 and 13 and on a portion of the silicon oxide film between the P type regions 12 and 13, respectively, by known evaporation and etching techniques. A region 16 involving the P-type regions 12 and 13 and the metal electrodes constitute a field effect transistor wherein the metal electrodes S, D, and G are respectively used as source electrode, drain electrode and gate electrode. A portion of the silicon oxide film 15 under the gate electrode G is made thinner to elevate the characteristics of the transistor, and the silicon oxide film is stabilized by involving phosphorous or an oxide thereof on the surface of the film. A portion of the gate electrode G extends over the silicon oxide film 15 to the other region 18 as interconnection 17. The interconnection 17 is disposed crossing the surface of a cavity 19 formed on a portion of the semiconductor substrate surface through the silicon oxide film 15.

As shown in FIG. 6*a*, in the semiconductor device the semiconductor surface covered with the silicon oxide film 15 has a crystal plane parallel to a {100} plane. The sloping surface or sidewall 20 of the cavity 19, over which the interconnection line 17 runs, is formed lying parallel to a {111} crystal plane. To form the cavity 19 having a crystal plane parallel to the {111} plane, a semiconductor substrate having a major surface lying parallel to the {100} plane is prepared and then it is selectively etched in an alkaline hydroxide etchant, for example, KOH or NaOH. The etching for forming the cavity is carried out by the same manner as described in Embodiment 1. In a semiconductor integrated circuit device having a plurality of elements, the cavity may be formed along the boundary of each element as a groove.

In the semiconductor device, the amount of electrons induced on the surface of the semiconductor substrate covered with the insulating film 15, especially on the portion under the gate, by the silicon oxide film is extremely small because the substrate surface lies parallel to a {100} crystal plane, however, the amount of the induced electrons on the semiconductor surface under the sloping surface 20 ({111} crystal plane) of the cavity 19 formed at the boundary of the element is so large that the semiconductor surface is in the same condition as if an $N^+$ layer were formed thereunder as shown in FIG. 5. Therefore, when a voltage is applied to the gate electrode G, a channel layer extending to the cavity 19 is offset and the cavity 19 effectively acts as a channel stopper. In this case the semiconductor surface under the gate electrode is a crystal plane parallel to a {100} 09 plane, whereby the drain current can be controlled in the state of a low threshold voltage and a high mutual conductance Gm.

The channel stopper can be applied equally to a case in which the insulating film is of silicon nitride and of a combination of silicon oxide and silicon nitride.

In this invention the channel stopper may be formed not only as a cavity but also as a projection 21 shown in FIG. 6*b* and it is needless to say that the beveled surface 22 may be used. The projection 21 can be made by etching the other surface portions of the semiconductor substrate in the above-mentioned alkaline etchant such as KOH or NaOH.

EMBODIMENT 3

FIG. 7 shows another embodiment involving a diode, in which reference numeral 31 designates an N-type silicon substrate having a {100} crystal plane as a major surface, reference numeral 32 a P-type region formed by selectively diffusing an impurity, reference numeral 33 a silicon oxide film formed by a thermal oxidization technique or thermal decomposition of organic silane, reference numeral 34 an electrode ohmically contacting with the P-type region 32, reference numeral 35 an electrode ohmically contacting with the major surface of the silicon substrate 31. A groove 36 surrounding the P-type region 32 is formed on the major surface of the substrate 31.

In this embodiment the surface of the groove 36 exposes a crystal plane other than a {100} plane, for example, a {111} plane, therefore the amount of electrons induced thereon is larger and an N-rich region ( $N^+$) is formed. Consequently, a channel layer generated on the major surface of the silicon substrate ( {100} crystal plane) is stopped by the groove 36.

In accordance with this invention the cavity or the projection is effectively used to stop the occurrence of a parasitic channel which causes to enlarge the area of the PN junction and thereby causes to break down an electric isolation between semiconductor circuit elements, so called, parasitic MOS.

What I claim is:

1. A semiconductor device comprising a semiconductor substrate having a substantially plane major surface lying substantially parallel to {100} crystal plane, a semiconductor circuit element formed in a portion of said major surface with at least one semiconductor region defined by a PN junction from said substrate, any PN junction which constitutes said circuit element terminating at said major surface, means for effecting a channel stop comprising a cavity formed in another portion of said major surface apart from said semiconductor circuit element, and having a wall surface lying substantially parallel to a {111} crystal plane and a flat bottom surface lying substantially parallel to said major surface, an insulating film covering said major surface and the surface of said cavity, a first contact terminal for said semiconductor circuit element provided on said insulating film, a second contact terminal provided on another portion of said insulating film spaced from said first contact terminal, a conducting path provided on said insulating film so as to electrically connect said first contact terminal to said second contact terminal, said conducting path extending over the wall surface and the bottom surface of said cavity.

2. A semiconductor device as defined in claim 1, wherein said cavity has a depth not less than 1 micron.

3. A semiconductor device comprising a semiconductor substrate having a substantially plane major surface lying substantially parallel to a {100} crystal plane, a semiconductor circuit element formed in a portion of said major surface with at least one semiconductor region defined by a PN junction terminating at said major surface, a projection formed on another portion of said major surface spaced from said semiconductor circuit element, and having a crystal plane lying substantially parallel to a {111} crystal plane, an insulating film covering said major surface and the surface of said projection, a first contact terminal for said semiconductor circuit element provided on said insulating film, a second contact terminal provided on another portion of said insulating film spaced from said first contact terminal, a conducting path provided on said insulating film so as to electrically connect said first contact terminal to said second contact terminal, said conducting path extending over at least a portion of the surface of said projection.

4. A semiconductor device as defined in claim 3, wherein said projection has a height not less than 1 micron.

5. A semiconductor device comprising a semiconductor substrate having a substantially plane major surface lying substnatially parallel to a {100 }crystal plane, a semiconductor circuit element formed in a portion of said major surface with at least one semiconductor region defined by a PN junction terminating at said major surface, means for effecting a channel stop comprising a projection formed on another portion of said major surface spaced from said semiconductor circuit element and having a slanting surface lying substantially parallel to a {111} plane and a top surface lying substantially parallel to said major surface, an insulating film covering said major surface and the surface of said projection, a first contact terminal for said semiconductor circuit element provided on said insulating film, a second contact terminal provided on another portion of said insulating film spaced from said first contact terminal, a conducting path provided on said insulating film so as to electrically connect said first contact terminal to said second contact terminal, said conducting path extending over at least a portion of the surface of said projection.

6. A semiconductor device as defined in claim 5, wherein said projection has a height not less than 1 micron.

* * * * *